US007412380B1

(12) United States Patent
Avendano et al.

(10) Patent No.: US 7,412,380 B1
(45) Date of Patent: Aug. 12, 2008

(54) AMBIENCE EXTRACTION AND MODIFICATION FOR ENHANCEMENT AND UPMIX OF AUDIO SIGNALS

(75) Inventors: Carlos Avendano, Campbell, CA (US); Michael Goodwin, Scotts Valley, CA (US); Ramkumar Sridharan, Capitola, CA (US); Martin Wolters, Nuremberg (DE); Jean-Marc Jot, Aptos, CA (US)

(73) Assignee: Creative Technology Ltd., Singapore (SG)

( * ) Notice: Subject to any disclaimer, the term of this patent is extended or adjusted under 35 U.S.C. 154(b) by 712 days.

(21) Appl. No.: 10/738,361

(22) Filed: Dec. 17, 2003

(51) Int. Cl.
*G10L 19/00* (2006.01)
*G10L 21/00* (2006.01)
*H04R 5/00* (2006.01)
*H04R 5/02* (2006.01)
*H03G 3/00* (2006.01)

(52) U.S. Cl. .......................... 704/216; 704/224; 704/226; 704/500; 381/1; 381/17; 381/61; 381/307

(58) Field of Classification Search ..................... 381/1, 381/61, 307, 17; 704/216, 500, 226, 224
See application file for complete search history.

(56) References Cited

U.S. PATENT DOCUMENTS 4,024,344 A * 5/1977 Dolby et al. .................. 381/27
5,671,287 A * 9/1997 Gerzon ........................ 381/17
5,872,851 A * 2/1999 Petroff ........................ 381/18
6,285,767 B1 * 9/2001 Klayman ..................... 381/17
6,473,733 B1 * 10/2002 McArthur et al. ........... 704/224
6,917,686 B2 * 7/2005 Jot et al. ....................... 381/63
6,999,590 B2 * 2/2006 Chen ............................ 381/1
7,006,636 B2 * 2/2006 Baumgarte et al. ............ 381/17
7,076,071 B2 * 7/2006 Katz .......................... 381/307
2002/0136412 A1 * 9/2002 Sugimoto ...................... 381/1
2002/0154783 A1 * 10/2002 Fincham ...................... 381/17
2004/0212320 A1 * 10/2004 Dowling et al. ............. 315/291

OTHER PUBLICATIONS

U.S. Appl. No. 10/738,607, filed Dec. 2003, Avendano et al.*

J. B. Allen, D. A. Berkley, and J. Blauert. Multimicrophone signal-processing technique to remove room reverberation from speech signals. J. Acoust. Soc. Am. 62, 912-915. (1977), DOI:10.1121/1.38162.*

U.S. Appl. No. 10/163,158, filed Jun. 4, 2002, Avendano et al.

U.S. Appl. No. 10/163,168, filed Jun. 4, 2002, Avendano et al.

Carlos Avendano and Jean-Marc Jot: *Ambience Extraction and Synthesis from Stereo Signals for Multi-Channel Audio Up-Mix*; vol. II—1957-1960: © 2002 IEEE.

Jean-Marc Jot and Carlos Avendano: *Spatial Enhancement of Audio Recordings*; AES 23rd International Conference, Copenhagen, Denmark, May 23-25, 2003.

Carlos Avendano: *Frequency-Domain Source Identification and Manipulation in Stereo Mixes for Enhancement, Suppression and Re-Panning Applications*; 2003 IEEE Workshop on Applications of Signed Processing to Audio and Acoustics; Oct. 19-22, 2003, New Paltz, NY.

* cited by examiner

*Primary Examiner*—Patrick N. Edouard
*Assistant Examiner*—Paras Shah
(74) *Attorney, Agent, or Firm*—Van Pelt, Yi & James LLP

(57) ABSTRACT

Modifying an audio signal comprising a plurality of channel signals is disclosed. At least selected ones of the channel signals are transformed into a time-frequency domain. The at least selected ones of the channel signals are compared in the time-frequency domain to identify corresponding portions of the channel signals that are not correlated or are only weakly correlated across channels. The identified corresponding portions of said channel signals are modified.

16 Claims, 15 Drawing Sheets

AMBIENCE EXTRACTION AND MODIFICATION FOR ENHANCEMENT AND UPMIX OF AUDIO SIGNALS

INCORPORATION BY REFERENCE

U.S. patent application Ser. No. 10/163,158, entitled Ambience Generation for Stereo Signals, filed Jun. 4, 2002, is incorporated herein by reference for all purposes. U.S. patent application Ser. No. 10/163,168, entitled Stream Segregation for Stereo Signals, filed Jun. 4, 2002, is incorporated herein by reference for all purposes.

This application is filed concurrently with co-pending U.S. patent application Ser. No. 10/738,607 entitled "Extracting and Modifying a Panned Source for Enhancement and Upmix of Audio Signals" and filed on Dec. 17, 2003, which is incorporated herein by reference for all purposes.

FIELD OF THE INVENTION

The present invention relates generally to digital signal processing. More specifically, ambience extraction and modification for enhancement and upmix of audio signals is disclosed.

BACKGROUND OF THE INVENTION

Recording engineers use various techniques, depending on the nature of a recording (e.g., live or studio), to include "ambience" components in a sound recording. Such components may be included, for example, to give the listener a sense of being present in a room in which the primary audio content of the recording (e.g., a musical performance or speech) is being rendered.

Ambience components are sometimes referred to as "indirect" components, to distinguish them from "direct path" components, such as the sound of a person speaking or singing, or a musical instrument or other sound source, that travels by a direct path from the source to a microphone or other input device. Ambience components, by contrast, travel to the microphone or other input device via an indirect path, such as by reflecting off of a wall or other surface of or in the room in which the audio content is being recorded, and may also include diffuse sources, such as applause, wind sounds, etc., that do not arrive at the microphone via a single direct path from a point source. As a result, ambience components typically occur naturally in a live sound recording, because some sound energy arrives at the microphone(s) used to make the recording by such indirect paths and/or from such diffuse sources.

For certain types of studio recordings, ambience components may have to be generated and mixed in with the direct sources recorded in the studio. One technique that may be used is to generate reverberation for one or more direct path sources, to simulate the indirect path(s) that would have been present in the case of a live recording.

Different listeners may have different preferences with respect to the level of ambience included in a sound recording (or other audio signal) as rendered via a playback system. The level preferred by a particular listener may, for example, be greater or less than the level included in the sound recording as recorded, either as a result of the characteristics of the room, the recording equipment used, microphone placement, etc. in the case of a live recording, or as determined by a recording engineer in the case of a studio recording to which generated ambience components have been added.

Therefore, there is a need for a way to allow a listener to control the level of ambience included in the rendering of a sound recording or other audio signal as rendered.

In addition, certain listeners may prefer a particular ambience level, relative to overall signal level, regardless of the level of ambience included in the original audio signal. For such users, there is a need for a way to normalize the output level of ambience so that the ambience to overall signal ratio is the same regardless of the level of ambience included in the original signal.

Finally, listeners with surround sound systems of various configurations (e.g., five speaker, seven speaker, etc.) need a way to "upmix" a received audio signal, if necessary, to make use of the full capabilities of their playback system, including by generating audio data comprising an ambience component for one or more channels, regardless of whether the received audio signal comprises a corresponding channel. In such embodiments, listeners further need a way to control the level of ambience in such channels in accordance with their individual preferences.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION

Figure 1A:
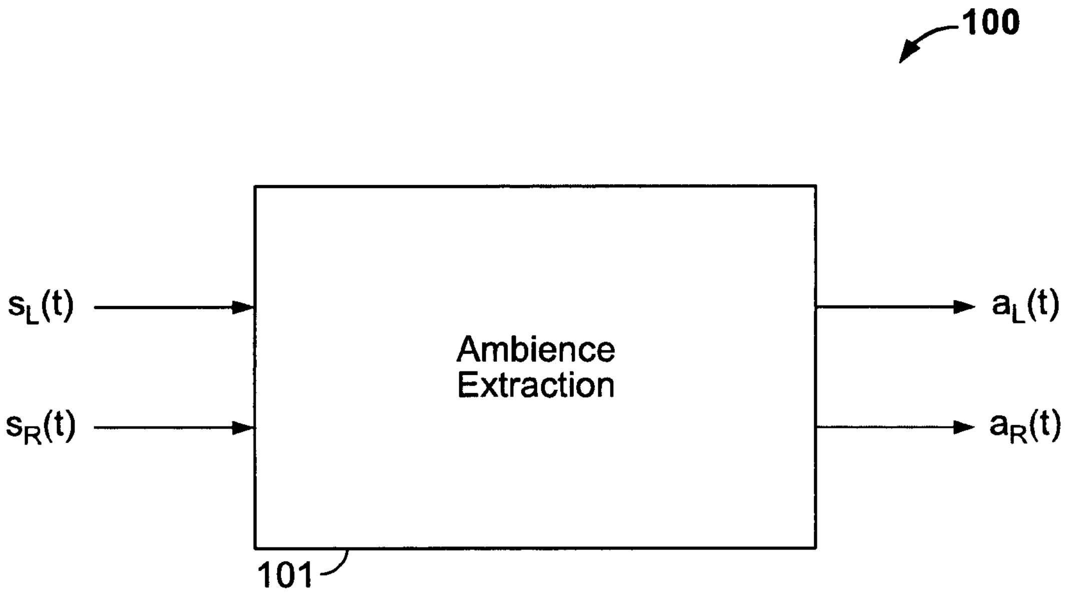
FIG. 1A illustrates a system for extracting ambience components from a stereo signal.

It should be appreciated that the present invention can be implemented in numerous ways, including as a process, an apparatus, a system, or a computer readable medium such as a computer readable storage medium or a computer network wherein program instructions are sent over optical or electronic communication links. It should be noted that the order of the steps of disclosed processes may be altered within the scope of the invention.

A detailed description of one or more preferred embodiments of the invention is provided below along with accompanying figures that illustrate by way of example the principles of the invention. While the invention is described in connection with such embodiments, it should be understood that the invention is not limited to any embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention. The present invention may be practiced according to the claims without some or all of these specific details. For the purpose of clarity, technical material that is known in the technical fields related to the invention has not been described in detail so that the present invention is not unnecessarily obscured.

Ambience extraction and modification for enhancement and upmix of audio signals is disclosed. In one embodiment, ambience components of a received signal are identified and enhanced or suppressed, as desired. In one embodiment, ambience components are identified and extracted, and used to generate one or more channels of audio data comprising ambience components to be routed to one or more surround channels (or other available channels) of a multichannel playback system. In one embodiment, a user may control the level of the ambience components comprising such generated channels. These and other embodiments are described in more detail below.

As used herein, the term "audio signal" comprises any set of audio data susceptible to being rendered via a playback system, including without limitation a signal received via a network or wireless communication, a live feed received in real-time from a local and/or remote location, and/or a signal generated by a playback system or component by reading data stored on a storage device, such as a sound recording stored on a compact disc, magnetic tape, flash or other memory device, or any type of media that may be used to store audio data.

1. Identification and Extraction of Ambience Components

One characteristic of a typical ambience component of an audio signal is that the ambience components of left and right side channels of a multichannel (e.g., stereo) audio signal typically are weakly correlated. This occurs naturally in most live recordings, e.g., due to the spacing and/or directivity of the microphones used to record the left and right channels (in the case of a stereo recording). In the case of certain studio recordings, a recording engineer may have to take affirmative steps to decorrelate the ambience components added to the left and right channels, respectively, to achieve the desired envelopment effect, especially for "off axis" listening (i.e., from a position not equidistant from the left and right speakers, for example).

FIG. 1A illustrates a system for extracting ambience components from a stereo signal. The system 100 comprises an ambience extraction module 101 configured to receive as inputs a left channel time-domain signal $s_L(t)$ and a right channel time-domain signal $s_R(t)$ and provide as output an extracted left channel ambience signal $a_L(t)$ extracted from the left channel input signal and an extracted right channel ambience signal $a_R(t)$ extracted from the right input channel. In one embodiment, the fact that ambience components are weakly correlated between the left and right channels is used by the system 100 to identify and extract the ambience components. While the system 100 of FIG. 1A is shown extracting ambience components from a stereo input signal, the present disclosure is not limited to extracting ambience from a stereo signal and the techniques described herein may be applied as well to extracting ambience components from more than two input signals including such components.

U.S. patent application Ser. No. 10/163,158 describes identifying and extracting ambience components from an audio signal. The technique described therein makes use of the fact that the ambience components of the left and right channels of a stereo (or other multichannel) audio signal typically are not correlated or are only weakly correlated. The received signals are transformed from the time domain to the time-frequency domain, and components that are not correlated or are only weakly correlated between the two channels are identified and extracted.

Figure 1B:
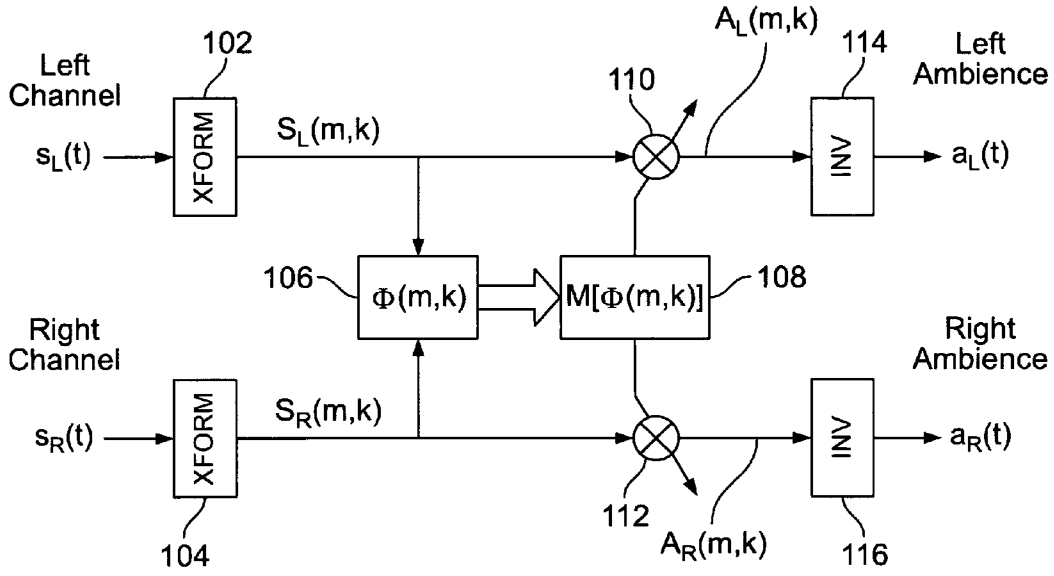
FIG. 1B is a block diagram illustrating the ambience signal extraction method used in one embodiment.

In one embodiment, ambience extraction is based on the concept that, in a time-frequency domain, for instance the short-time Fourier Transform (STFT) domain, the correlation between left and right channels will be high in time-frequency regions where the direct component is dominant, and low in regions dominated by the reverberation tails or diffuse sources. FIG. 1B is a block diagram illustrating the ambience signal extraction method used in one embodiment. Let us first denote the time-frequency domain representations of the left $s_L(t)$ and right $s_R(t)$ stereo signals as $S_L(m,k)$ and $S_R(m,k)$ respectively, where m is the frame index and k is the frequency index. In one embodiment, the short-time Fourier transform is used and the frame index m is a short-time index. We define the following short-time statistics $$\Phi_{LL}(m,k)=\Sigma S_L^*(n,k)S_L^*(n,k), \quad (1a)$$

$$\Phi_{RR}(m,k)=\Sigma S_R^*(n,k)S_R^*(n,k), \quad (1b)$$

$$\Phi_{LR}(m,k)=\Sigma S_L^*(n,k)S_R^*(n,k), \quad (1c)$$

where the sum is carried out over a given time interval and * denotes complex conjugation. Using these statistical quantities we define the inter-channel short-time coherence function in one embodiment as $$\Phi(m,k)=|\Phi_{LR}(m,k)|[\Phi_{LL}(m,k)\Phi_{RR}(m,k)]^{-1/2}. \quad (2a)$$

In one alternative embodiment, we define the inter-channel short-time coherence function as $$\Phi(m,k)=2|\Phi_{LR}(m,k)|[\Phi_{LL}(m,k)+\Phi_{RR}(m,k)]^{-1}. \quad (2b)$$

The coherence function $\Phi(m,k)$ is real and will have values close to one in time-frequency regions where the direct path is dominant, even if the signal is amplitude-panned to one side. In this respect, the coherence function is more useful than a correlation function. The coherence function will be close to zero in regions dominated by the reverberation tails or diffuse sources, which are assumed to have low correlation between channels. In cases where the signal is panned in phase and amplitude, such as in the live recording technique, the coherence function will also be close to one in direct-path regions as long as the window duration of the STFT is longer than the time delay between microphones.

Audio signals are in general non-stationary. For this reason the short-time statistics and consequently the coherence function will change with time. To track the changes of the signal we introduce a forgetting factor $\lambda$ in the computation of the cross-correlation functions, thus in practice the statistics in (1) are computed as:

$$\Phi_{ij}(m,k)=\lambda\Phi_{ij}(m-1,k)+(1-\lambda)S_i(m,k)S_j^*(m,k). \quad (3)$$

Given the properties of the coherence function (e.g., (2a) or (2b) above), one way of extracting the ambience of the stereo recording would be to multiply the left and right channel STFTs by $1-\Phi(m,k)$. Since $\Phi(m,k)$ has a value close to one for direct components and close to zero for ambient components, $1-\Phi(m,k)$ will have a value close to zero for direct components and close to one for ambient components. Multiplying the channel STFTs by $1-\Phi(m,k)$ will thus tend to extract the ambient components and suppress the direct components, since low-coherence (ambient) components are weighted more than high-coherence (direct) components in the multiplication. After the left and right channel STFTs are multiplied by this weighting function, the two time-domain ambience signals $a_L(t)$ and $a_R(t)$ are reconstructed from these modified transforms via the inverse STFT. A more general form used in one embodiment is to weigh the channel STFTs with a nonlinear function of the short-time coherence, i.e.

$$A_L(m,k)=S_L(m,k)M[\Phi(m,k)] \quad (4a)$$

$$A_R(m,k)=S_R(m,k)M[\Phi(m,k)], \quad (4b)$$

where $A_L(m,k)$ and $A_R(m,k)$ are the modified, or ambience transforms. In one embodiment, the modification function M is nonlinear. In one such embodiment, the behavior of the nonlinear function M that we desire for purposes of ambience extraction is such that time-frequency regions of S(m,k) with low coherence values are not modified and time-frequency regions of S(m,k) with high coherence values above some threshold are heavily attenuated to remove the direct path component. Additionally, the function should be smooth to avoid artifacts. One function that presents this behavior is the hyperbolic tangent, thus we define M in one embodiment as:

$$M[\Phi(m,k)]=0.5(\mu_{max}-\mu_{min})\tan h\{\sigma\pi(\Phi_o-\Phi(m,k))\}+0.5(\mu_{max}+\mu_{min}) \quad (5)$$

where the parameters $\mu_{max}$ and $\mu_{min}$ define the range of the output, $\Phi_o$ is the threshold and $\sigma$ controls the slope of the function. The value of $\mu_{max}$ is set to one in one embodiment in which the non-coherent regions are to be extracted but not enhanced by operation of the modification function M. The value of $\mu_{min}$ determines the floor of the function and in one embodiment this parameter is set to a small value greater than zero to avoid artifacts such as those that can occur in spectral substraction.

Referring further to FIG. 1B, the inputs to the system are the left and right channel signals of the stereo recording, which are transformed into a time-frequency domain by transform blocks 102 and 104. In one embodiment, the transform blocks 102 and 104 perform the short-time Fourier transform (STFT). The parameters of the STFT are the window length N, the transform size K and the stride length L. The coherence function is estimated in block 106 and mapped in block 108 to generate the multiplication coefficients that modify the short-time transforms. The coefficients are applied in multipliers 110 and 112. After modification, the time-domain ambience signals are synthesized by applying the appropriate inverse transform in blocks 114 and 116. In embodiments in which blocks 102 and 104 perform the STFT, blocks 114 and 116 are configured to perform the inverse STFT.

2. Modifying the Ambience Level in an Audio Signal

The description of the preceding section focuses on embodiments in which the ambience component of an audio signal is extracted, such as for upmix. In this section, we describe identifying and modifying the level of the ambience component of an audio signal.

Figure 2:
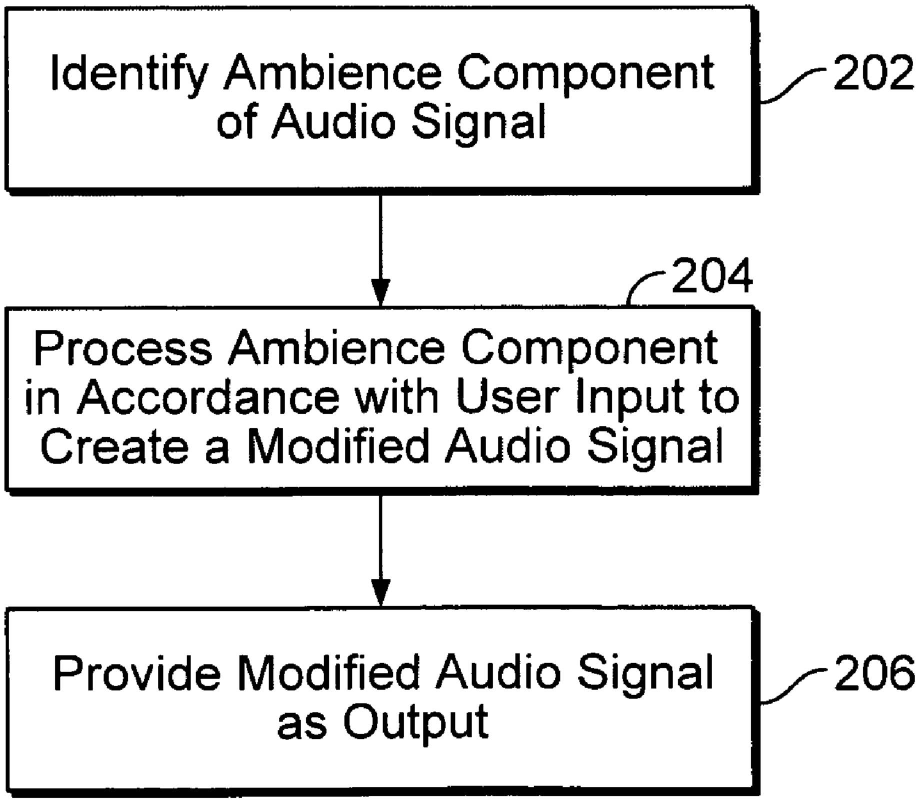
FIG. 2 is a flow chart illustrating a process used in one embodiment to identify and modify an ambience component in an audio signal.

FIG. 2 is a flow chart illustrating a process used in one embodiment to identify and modify an ambience component in an audio signal. The process begins in step 202, in which the ambience component of an audio signal is identified. In one embodiment, as described more fully below, a coherence function such as described in the preceding section is used in step 202 to identify the ambience component of an audio signal by identifying portions of the signal that have low coherence between left and right channels of the audio signal. In some embodiments, the low coherence portions of the signal may not be identified in a strict sense, and the coherence value may be used as a measure of the extent to which the corresponding portions of the signal are correlated across channels. In step 204, the ambience component is processed in accordance with a user input to create a modified audio signal. In one embodiment, the processing performed in step 204 may comprise performing an n-channel "upmix" comprising extracting an ambient component from one or more channels of a received audio signal, using the techniques described herein, and using such components to generate a new (or modified) signal for one or more of the n channels. In one embodiment, the processing performed in step 204 may comprise enhancing or suppressing the ambience level of an audio signal. In some embodiments, the processing performed in step 204 may comprise applying to the audio signal a modification function the value of which for any particular portion of the audio signal is determined at least in part by the corresponding value of the coherence function. In step 206, the modified audio signal is provided as output.

Figure 3A:
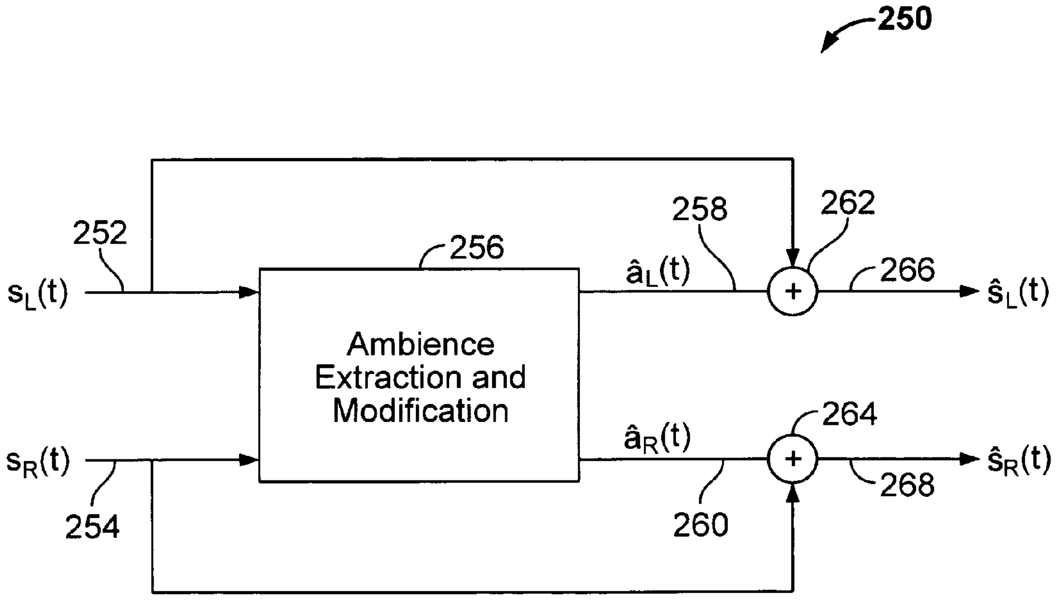
FIG. 3A is a block diagram of a system used in one embodiment to identify and modify an ambience component in an audio signal.

FIG. 3A is a block diagram of a system used in one embodiment to identify and modify an ambience component in an audio signal. The system 250 receives as input on lines 252 and 254, respectively, the time domain signals $s_L(t)$ and $s_R(t)$. The signals $s_L(t)$ and $s_R(t)$ are provided to an ambience extraction and modification block 256, which is configured to extract the ambience components from the respective signals and modify the extracted ambience components to provide as output on lines 258 and 260, respectively, modified ambience components $\hat{a}_L(t)$ and $\hat{a}_R(t)$. The left channel modified ambience component $\hat{a}_L(t)$ and the unmodified left channel signal $s_L(t)$ are provided to a summation block 262, which adds them together and provides as output on line 266 a modified left channel signal $\hat{s}_L(t)$ incorporating the modified ambience component. The right channel modified ambience component $\hat{a}_R(t)$ and the unmodified right channel signal $s_R(t)$ are provided to a summation block 264, which adds them together and provides as output on line 268 a modified right channel signal $\hat{s}_L(t)$ incorporating the modified ambience component.

Figure 3B:
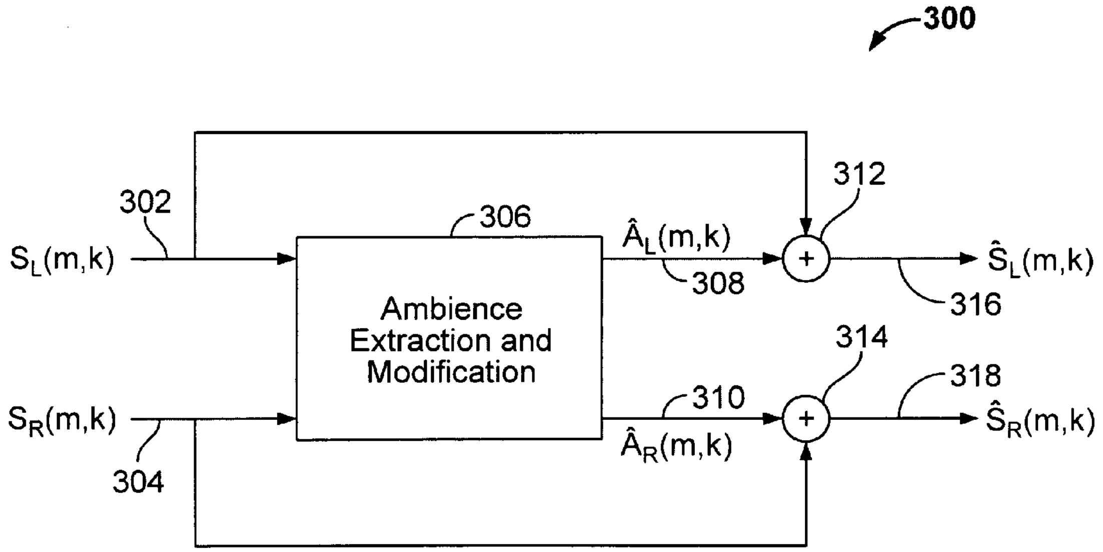
FIG. 3B is a block diagram of a system used in one embodiment to identify and modify an ambience component in an audio signal.

FIG. 3B is a block diagram of a system used in one embodiment to identify and modify an ambience component in an audio signal. The system 300 receives as input on lines 302 and 304, respectively, the time-frequency domain signals $S_L(m,k)$ and $S_R(m,k)$, which in one embodiment are obtained by transforming time-domain left and right channel signals into the time-frequency domain, as described above in connection with FIG. 1B. The signals $S_L(m,k)$ and $S_R(m,k)$ are provided to an ambience extraction and modification block 306, which is configured to extract the ambience components from the respective signals and modify the extracted ambience components to provide as output on lines 308 and 310, respectively, modified ambience components $\hat{A}_L(m,k)$ and $\hat{A}_R(m,k)$. The left channel modified ambience component $\hat{A}_L(m,k)$ and the unmodified left channel signal $S_L(m,k)$ are provided to a summation block 312, which adds them together and provides as output on line 316 a modified left channel signal $\hat{S}_L(m,k)$ incorporating the modified ambience component. The right channel modified ambience component $\hat{A}_R(m,k)$ and the unmodified right channel signal $S_R(m,k)$ are provided to a summation block 314, which adds them together and provides as output on line 318 a modified right channel signal $\hat{S}_R(m,k)$ incorporating the modified ambience component.

Figure 4:
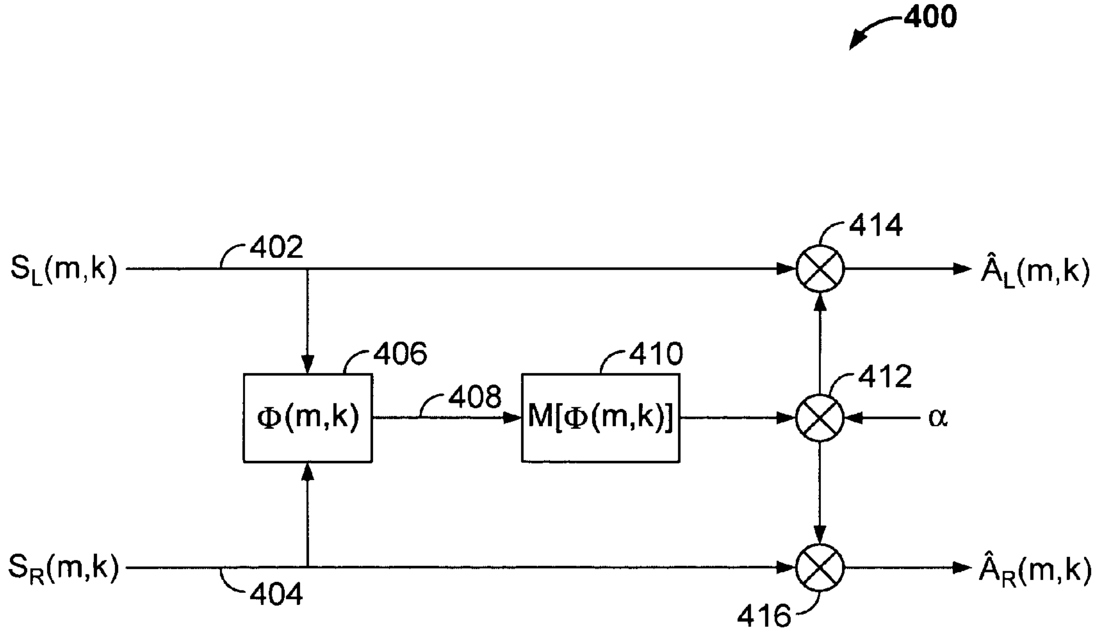
FIG. 4 is a block diagram of a system used in one embodiment to extract and modify an ambience component, as in block 306 of FIG. 3B.

FIG. 4 is a block diagram of a system used in one embodiment to extract and modify an ambience component, as in block 306 of FIG. 3B. The system 400 receives as input on lines 402 and 404, respectively, the time-frequency domain signals $S_L(m,k)$ and $S_R(m,k)$. Each of the received signals is provided to a coherence function block 406 configured to determine coherence function values for the received signals, as described above in connection with FIG. 1B. The coherence values are provided via line 408 to modification function block 410. In one embodiment, the modification function block 410 operates as described above in connection with block 108 of FIG. 1B. In particular, in one embodiment the modification function is such that highly correlated/coherent portions of the received audio signal are heavily attenuated and uncorrelated or weakly correlated portions are assigned a modification function value that would leave the corresponding portion of the signal (e.g., a particular time-frequency bin) unmodified or largely unmodified if no other modification were performed (e.g., in one embodiment, the modification function value for uncorrelated portions of the signal would be equal to or nearly equal to one). In one embodiment, the application of the modification function of block 410 may be limited to frequency bins within a prescribed band of frequencies. In one such embodiment, a user input may determine at least in part the lower and or upper frequency limit of the band of frequencies to which the modification is applied. The modification function block 410 provides modification function values to a multiplication block 412. The multiplication block 412 also receives as input a modification factor $\alpha$. In one embodiment, as described more fully below, the modification factor $\alpha$ is a user-defined value. In one embodiment, a user interface is provided to enable a user to provide as input a value for the modification factor $\alpha$. The output of the multiplication block 412, comprising the modification function values provided as output by block 410 multiplied by the modification factor $\alpha$, is provided as an input to each of the multiplication blocks 414 and 416. The original left and right channel signals, $S_L(m,k)$ and $S_R(m,k)$, also are provided as inputs to the multiplication blocks 414 and 416, respectively, resulting in a modified left channel ambience component $\hat{A}_L(m,k)$ being provided as the output of multiplication block 414 and a modified right channel ambience component $\hat{A}_R(m,k)$ being provided as the output of multiplication block 416. The modified ambience components $\hat{A}_L(m,k)$ and $\hat{A}_R(m,k)$ as provided by the system 400 of FIG. 4 can be expressed as follows:

$$\hat{A}_L(m,k)=\alpha M[\Phi(m,k)]S_L(m,k) \quad (6a)$$

$$\hat{A}_R(m,k)=\alpha M[\Phi(m,k)]S_R(m,k) \quad (6b)$$

Figure 5:
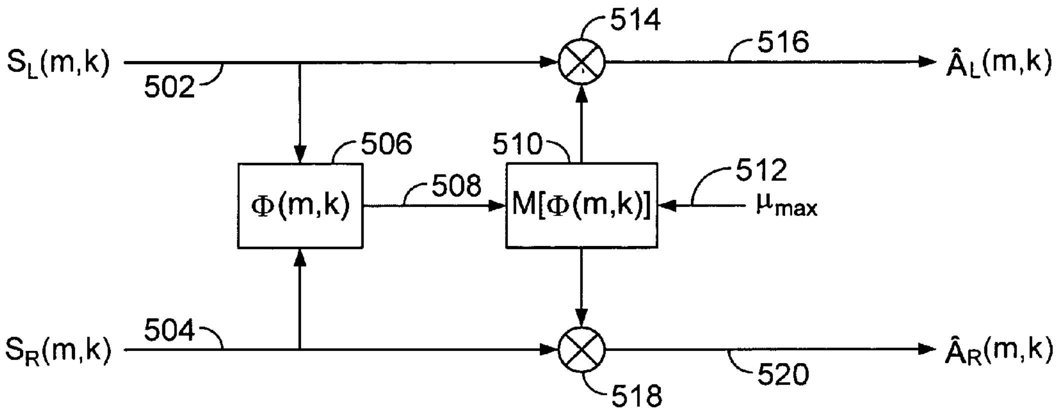
FIG. 5 is a block diagram of an alternative system used in one embodiment to extract and modify an ambience component, as in block 306 of FIG. 3B.

FIG. 5 is a block diagram of an alternative system used in one embodiment to extract and modify an ambience component, as in block 306 of FIG. 3B. The system 500 receives as input on lines 502 and 504, respectively, the time-frequency domain signals $S_L(m,k)$ and $S_R(m,k)$. Each of the received signals is provided to a coherence function block 506 configured to determine coherence function values for the received signals, as described above in connection with FIG. 1B. The coherence values are provided via line 508 to modification function block 510. The modification function block 510 also receives as an input on line 512 a maximum value $\mu_{MAX}$. In one embodiment, the modification function block 512 is configured to apply a modification function such as that set forth above as Equation (5). In one embodiment, the input $\mu_{MAX}$ provided via line 512 is used in Equation (5) as the maximum function value $\mu_{MAX}$. In one embodiment, the input received on line 512 is user-defined, such as an input provided via a user interface. In one embodiment, the modification function block 510 may also receive as an input, not shown in FIG. 5, a minimum value $\mu_{MIN}$. In one embodiment, the minimum value $\mu_{MIN}$ is used in Equation (5) as the minimum function value $\mu_{MIN}$. In one embodiment, the application of the modification function of block 510 may be limited to frequency bins within a prescribed band of frequencies. In one such embodiment, a user input may determine at least in part the lower and or upper frequency limit of the band of frequencies to which the modification is applied. The modification function values generated by the modification function block 510 are provided as inputs to multiplication blocks 514 and 518. The multiplication block 514 also receives as input the original left channel signal $S_L(m,k)$, which when multiplied by the modification function values provided by block 510 results in a modified left channel ambience component $\hat{A}_L(m,k)$ being provided as output on line 516. Similarly, the multiplication block 518 receives as input the original right channel signal $S_R(m,k)$, which when multiplied by the modification function values provided by block 510 results in a modified right channel ambience component $\hat{A}_R(m,k)$ being provided as output on line 520. In one embodiment, values for $\mu_{MAX}$ greater than one result in the ambience components of the received signal being enhanced, and values for $\mu_{MAX}$ less than one result in the ambience components being suppressed.

The systems shown in FIGS. 4 and 5 provide for user-controlled modification of an ambience component either by providing an input that determines the level of a multiplier, such as the modification factor $\alpha$ of FIG. 4, or by controlling a parameter of the modification function, such as the maximum modification function value $\mu_{MAX}$ of FIG. 5. As described above, these approaches enable a user to determine the amount or factor by which ambience components are modified. In such an approach, the output level of the modified ambience component relative to the overall signal level depends on the level of the ambience component included in the received signal. However, some users may prefer a certain level of ambience relative to the overall signal regardless of the level of ambience included in the original signal. A system configured to provide such a constant output level of ambience relative to the overall signal, regardless of the input signal, might be described as being configured to provide a "normalized" output level of ambience.

Figure 6:
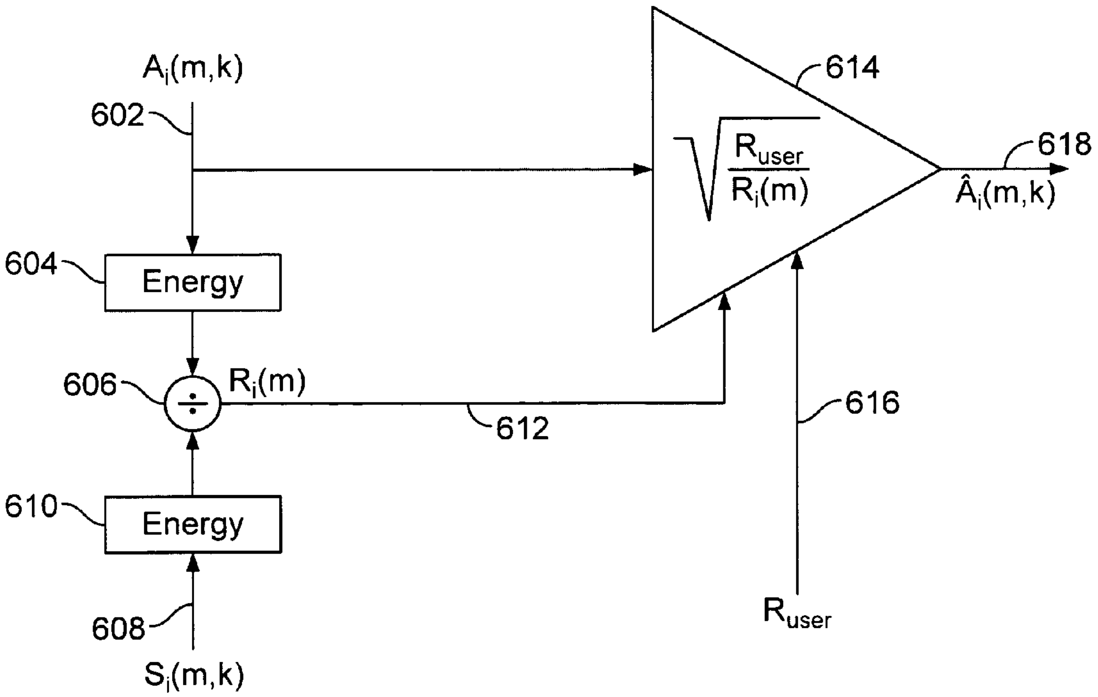
FIG. 6 is a block diagram illustrating an approach used in one embodiment to provide a normalized output level of ambience.

FIG. 6 is a block diagram illustrating an approach used in one embodiment to provide a normalized output level of ambience. Components for a single channel are shown. First, a system such as that illustrated in FIG. 1B is used to extract the ambience component from the channel, thereby generating the ambience signal $A_i(m,k)$ shown in FIG. 6 as being received on line 602. The received ambience component is processed by an ambience energy determination block 604, and the ambience energy level is provided as an input to division block 606. The corresponding channel of the original, unmodified audio signal $S_i$(m,k) is received on line 608 and provided to signal energy determination block 610, which provides the signal energy level as an input to division block 606. Division block 606 is configured to calculate the ratio of ambience energy to signal energy for the original, unmodified audio signal, i.e., $R_i(m)=A_i(m,k)/S_i(m,k)$. The ratio $R_i$(m) is provided via line 612 as a gain input to amplifier 614. Also provided to amplifier 614 as a gain input via line 616 is a user-specified desired ratio of ambience to signal RUSER. The extracted ambience signal $A_i$(m.k) also is provided as input to the amplifier 614. In one embodiment, as shown in FIG. 6, the gain of amplifier 614 is given by the following equation:

$$g_c = \sqrt{\frac{R_{USER}}{R_i(m)}} \tag{7}$$

As shown in FIG. 6, the output of amplifier 614 is provided on line 618 as a normalized modified ambience signal $\hat{A}_i$(m,k).

3. n-Channel Upmix Using Ambience Extraction Techniques

Figure 7:
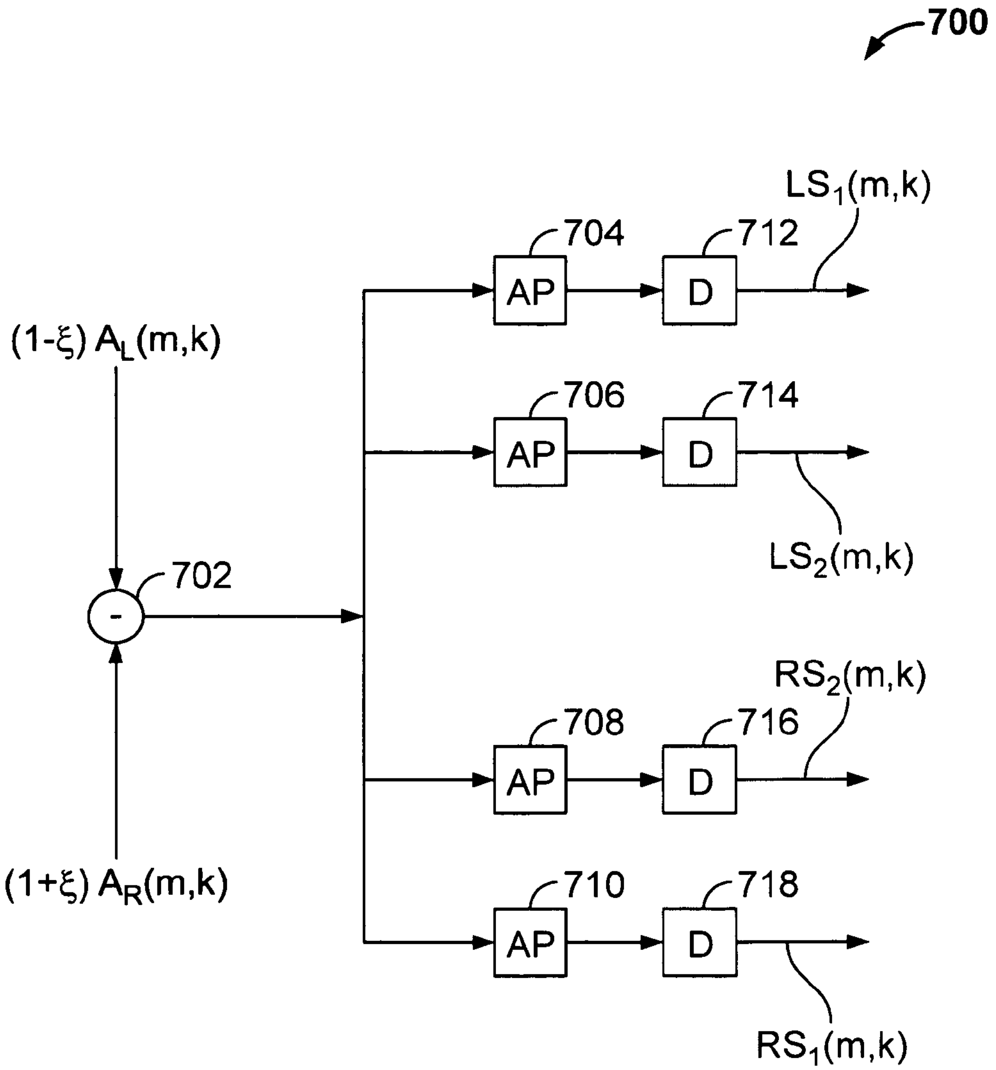
FIG. 7 is a block diagram of a system used in one embodiment to provide 2-to-n channel upmix.

FIG. 7 is a block diagram of a system used in one embodiment to provide 2-to-n channel upmix. The system 700 receives as input extracted left and right channel ambience components $A_L$(m,k) and $A_R$(m,k), multiplied by weighting factors (1−ξ) and (1+ξ), respectively. In one embodiment, ξ=0 and the unweighted extracted ambience components are used as inputs. In one embodiment, the left and right channel ambience components are extracted as described above in connection with FIG. 1B. The left and right channel ambience components $A_L$(m,k) and $A_R$(m,k) are provided as inputs to a difference block 702, the output of which is provided as an input into an allpass filter associated with each channel for which an extracted ambience-based signal is to be generated. In the case of the system 700 shown in FIG. 7, the output of the difference block 702 is provided as input to each of four different allpass filters 704, 706, 708, and 710. The system shown in FIG. 7 is used in one embodiment to generate signals for four surround channels in the context of a two-channel to seven-channel upmix. A typical seven-channel surround sound system has a left front speaker, a right front speaker, a center front speaker, and four surround speakers meant to be placed behind the listener (or listening area), two on the left and two on the right. In one embodiment, the system of FIG. 7 is used to generate surround signals for the four surround speakers. The allpass filters 704-710 are configured in one embodiment to introduce different phase adjustments to the extracted ambience-based signal provided as output by difference block 702, to decorrelate and de-localize the generated channels. In some embodiments, the signal output by difference block 702 would be converted back into the time domain prior to being processed by the allpass filters 704-710. The output of each of the allpass filters 704-710 is provided as input to a corresponding one of delay lines 712, 714, 716, and 718. In one embodiment, each of delay lines 712-718 is configured to introduce a different delay in the corresponding generated signal, further decorrelating the ambience-based generated signals. The respective outputs of delay lines 712-718 are provided as extracted ambience-based generated signals $LS_1$(m,k), $LS_2$(m,k), $RS_1$(m,k), and $RS_2$(m,k). The approach illustrated by FIG. 7 is particularly advantageous in that it can be scaled to generate as many ambience-based signals as may be needed to make use (or more full use) of the capabilities of a multichannel playback system. While the embodiment illustrated in FIG. 7 provides for 2-to-n channel upmix, the approach disclosed herein may be used for upmix with any number of input and/or output channels (i.e., m-to-n channel upmix). For m-to-n channel upmix, those of skill in the art would know to modify the coherence equations (e.g., (2a) or (2b)) used to take into consideration all of the channels that include an ambience component, which is determined based on the properties of the m-channel input signal.

Figure 8:
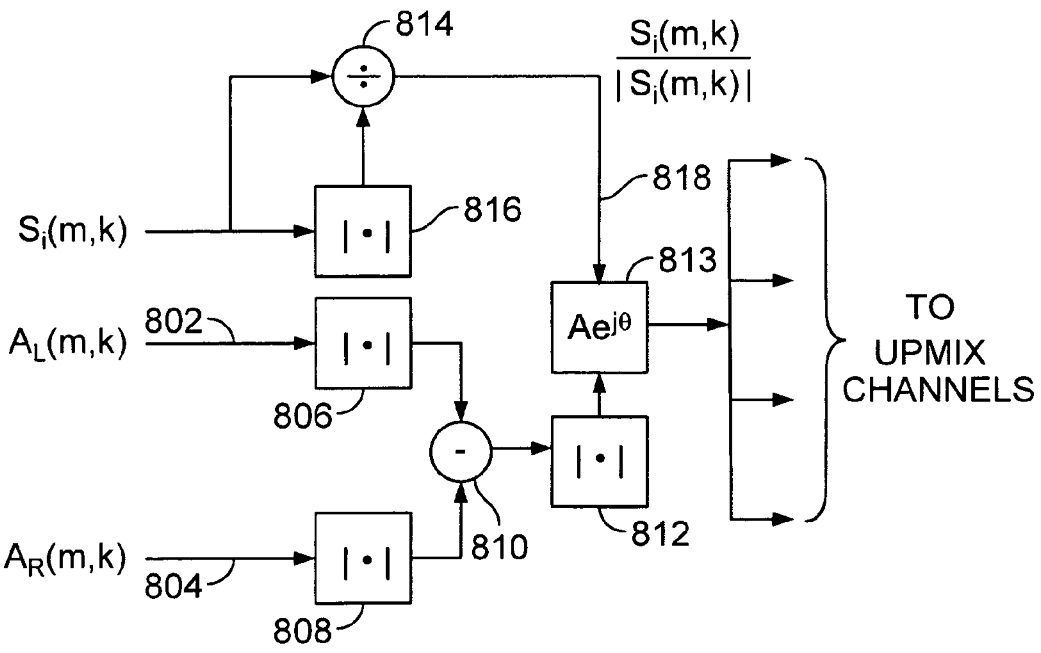
FIG. 8 illustrates a system used in one embodiment to provide 2-to-n channel upmix.

FIG. 8 illustrates a system used in one embodiment to provide 2-to-n channel upmix. The system 800 of FIG. 8 differs from the approach shown in FIG. 7 in that instead of taking the difference of the extracted left and right ambience components as complex values (embodying both magnitude and phase information), the differences of the magnitudes of the extracted left and right ambience components is taken, the magnitude of the difference values is determined, and then the phase of one of the input channels is applied to the result prior to splitting the signal and processing it using allpass filters and delay lines, as described above, to generate the required ambience-based channels. In one embodiment, using the approach shown in FIG. 8 may result in fewer audible artifacts than an approach such as the one shown in FIG. 7. In one embodiment, as shown in FIG. 8, the extracted left and right ambience components $A_L$(m,k) and $A_R$(m,k) are received on lines 802 and 804, respectively. The extracted left and right ambience components are then provided to magnitude determination blocks 806 and 808, respectively, and the difference of the magnitude values is determined by difference block 810. The magnitude of the difference values determined by block 810 is determined by magnitude determination block 812, and the results are provided as input to a magnitude-phase combiner 813, which combines the magnitudes with the corresponding phase information of one of the original channels from which the ambience components were extracted. As shown in FIG. 8, the phase information is determined in one embodiment by using division block 814 to divide the unmodified signal $S_i$(m,k) (which could be either $S_L$(m,k) or $S_R$(m,k) in the example shown in FIG. 8) by the corresponding magnitude values as determined by magnitude determination block 816. The output of division block 814 is then provided as the phase information input to magnitude-phase combiner 813 via line 818. The output of the magnitude-phase combiner 813 is provided to upmix channel lines 820, where in one embodiment the signal is split and processed by allpass filters and delay lines (not shown in FIG. 8) as described above to generate the desired upmix channels. In some embodiments, the output of magnitude-phase combiner 813 may be transformed back into the time domain prior to being split and processed by allpass filters and delay lines to generate the upmix channels. In some embodiments, magnitude determination block 812 may be omitted from the system of FIG. 8 and the magnitude-phase combiner 813 configured to determine the magnitude of the difference values provided by difference determination block 810.

Figure 9:
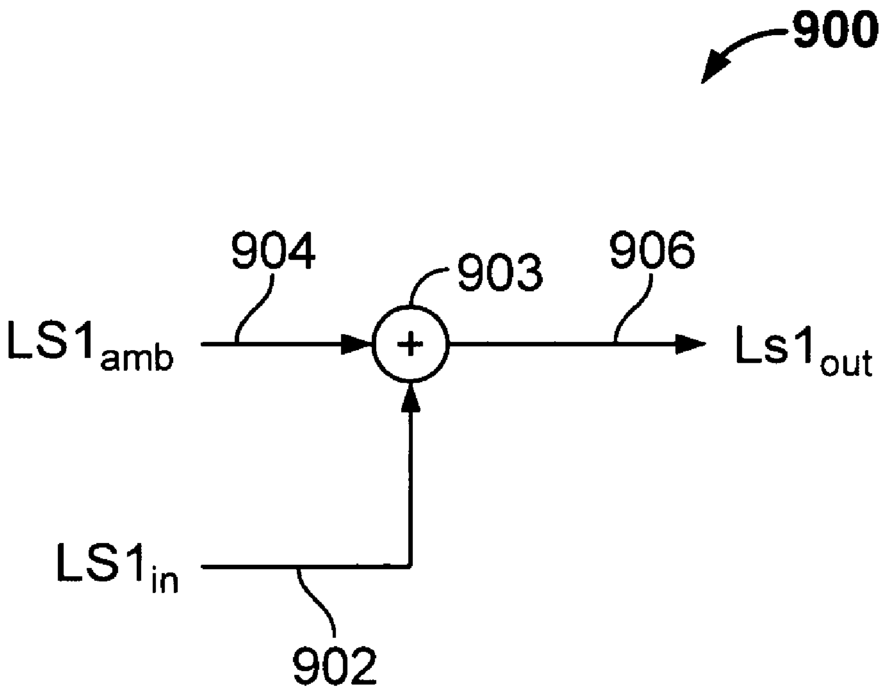
FIG. 9 illustrates a combiner block 900 used in one embodiment to combine a signal comprising a channel of a multichannel audio signal with a corresponding extracted ambience-based generated signal.

While the upmix approaches described above may be used to generate surround channel (or other channel) signals in cases where an input audio signal does not include a corresponding channel, the same approach may also be used with a multichannel input signal. In such a case, the use of the techniques described in this section would have the effect of adding ambience components to the channels for which (additional) extracted ambience-based content is generated. FIG. 9 illustrates a combiner block 900 used in one embodiment to combine a signal comprising a channel of a multichannel audio signal with a corresponding extracted ambience-based generated signal. In the example shown, the signals apply to a first left surround channel. The corresponding portion of the multichannel input audio signal $LS1_{in}$ is received on line 902 and provided to a summation block 903. The extracted ambience-based signal generated for the corresponding channel, denoted in FIG. 9 as signal $LS1_{amb}$, is received on line 904 and provided to summation block 903. In one embodiment, the extracted ambience-based signal is extracted from the left and right front channel signals, as described above. The combined signal $LS1_{out}$ is provided as output on line 906.

4. Modifying the Ambience Level with n-Channel Upmix

Figure 10A:
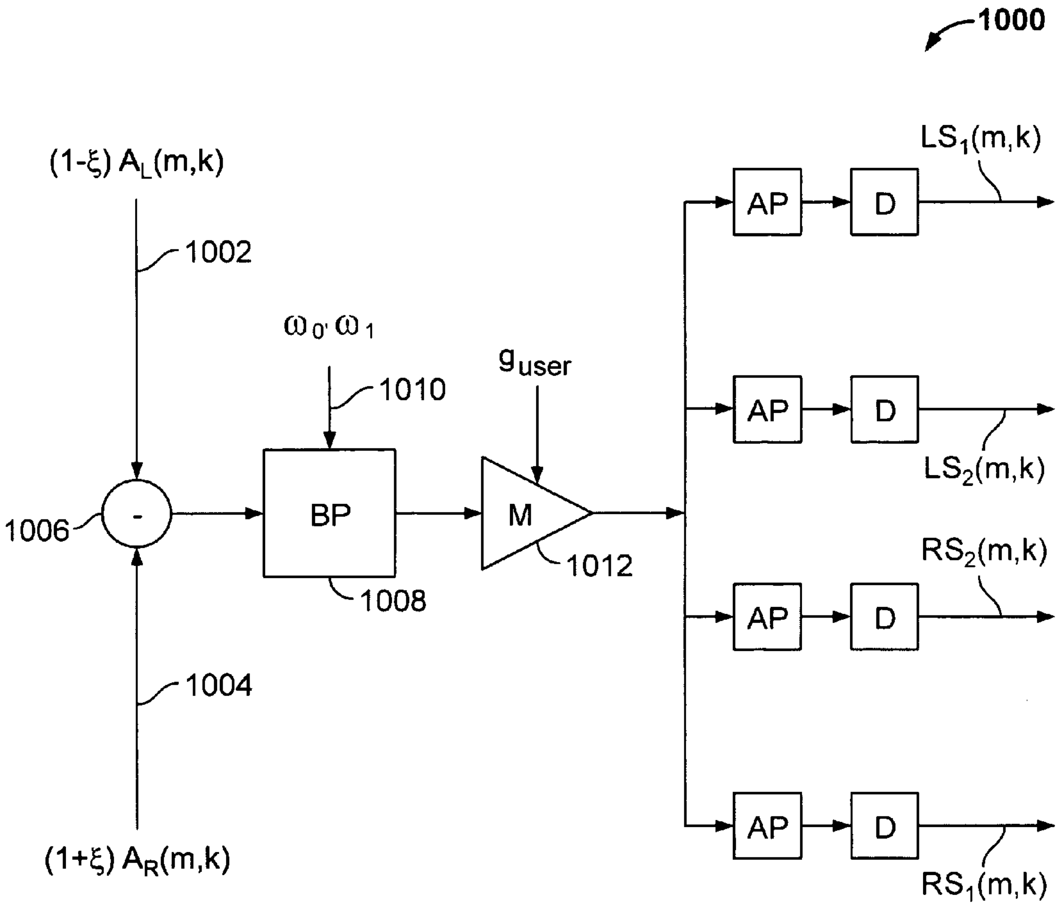
FIG. 10A is a block diagram of a system used in one embodiment to provide user control of the level of extracted ambience-based signals generated for upmix.

The upmix techniques described above may be adapted to incorporate user control of the level of the extracted ambience-based signal generated for the upmix channels. FIG. 10A is a block diagram of a system used in one embodiment to provide user control of the level of extracted ambience-based signals generated for upmix. The system 1000 receives on lines 1002 and 1004, respectively, extracted left and right channel ambience signals $A_L(m,k)$ and $A_R(m,k)$, multiplied by weighting factors $(1-\xi)$ and $(1+\xi)$, respectively. In one embodiment, $\xi=0$ and the unweighted extracted ambience components are used as inputs. The received ambience signals are provided to a difference block 1006, the output of which is provided to an optional bandpass filter 1008. In one embodiment, the bandpass filter 1008 has a lower cut-off frequency $\omega_0$ and an upper cut-off frequency $\omega_1$. In one embodiment, the bandpass filter 1008 is configured to receive as input on line 1010 user-controlled values for the upper and lower cut-off frequencies of the band. Providing such a feature allows a user to define the frequency band of the extracted ambience components used to generate the upmix channels. In one embodiment, the bandpass filter 1008 is omitted and the ambience components across all frequencies are used to generate the surround channels. In the system 1000 of FIG. 10A, the output of bandpass filter 1008 is provided to a variable gain amplifier 1012. The gain of the amplifier 1012 is determined by a user-controlled input $g_{user}$ provided to amplifier 1012. In one embodiment, the user employs a user interface to indicate a desired level of ambience content for the surround channels, and the level indicated at the interface is mapped to a value for the gain $g_{user}$. The output of amplifier 1012 is split and provided to a separate allpass filter for each of the channels for which an extracted ambience-based signal is to be generated. In the system 1000, signals are generated for four surround channels $LS_1(m,k)$, $LS_2(m,k)$, $RS_1(m,k)$, and $RS_2(m,k)$, and each has an allpass filter and delay line associated with it, as described above in connection with elements 704-718 of FIG. 7. In some embodiments, the output of amplifier 1012 may be transformed back into the time domain prior to being processed by the allpass filters and delay lines shown in FIG. 10A.

Figure 10B:
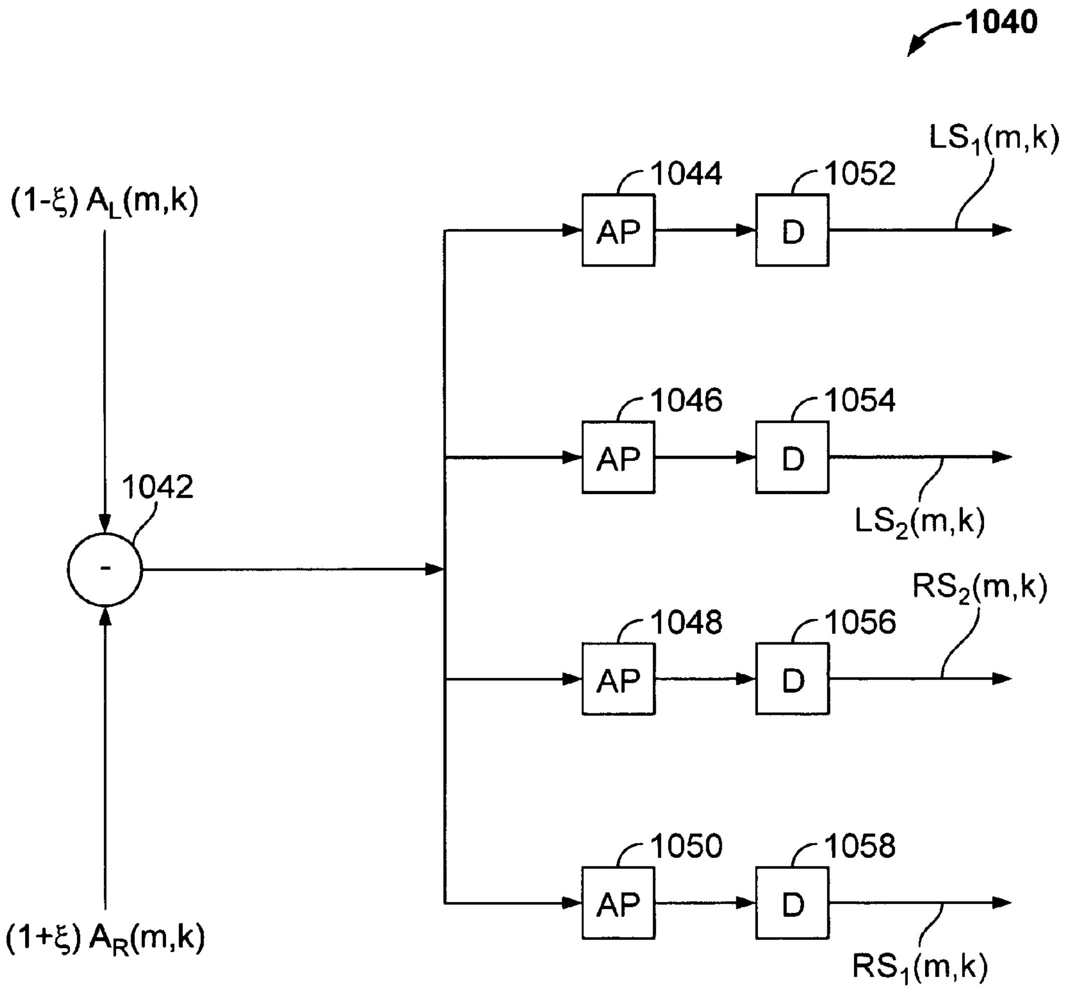
FIG. 10B is a block diagram of an alternative embodiment in which ambience extraction and modification are performed prior to using the extracted ambience components for upmix.

FIG. 10B is a block diagram of an alternative embodiment in which ambience extraction and modification are performed prior to using the extracted ambience components for upmix. The system 1040 receives as input extracted left and right channel ambience components $A_L(m,k)$ and $A_R(m,k)$, multiplied by weighting factors $(1-\xi)$ and $(1+\xi)$, respectively. In one embodiment, $\xi=0$ and the unweighted extracted ambience components are used as inputs. In one embodiment, the left and right channel ambience components are extracted as described above in connection with FIG. 1B and modified as described above in connection with FIG. 4 or FIG. 5. The left and right channel ambience components $A_L(m,k)$ and $A_R(m,k)$ are provided as inputs to a difference block 1042, the output of which is provided as an input to each of four different allpass filters 1044, 1046, 1048, and 1050. In some embodiments, the output of difference block 1042 is transformed back into the time domain prior to being processed by the allpass filters 1044, 1046, 1048, and 1050. The output of each of allpass filters 1044-1050 is provided as input to a corresponding one of delay lines 1052, 1054, 1056, and 1058. The respective outputs of delay lines 1052-1058 are provided as extracted ambience-based generated signals $LS_1(m,k)$, $LS_2(m,k)$, $RS_1(m,k)$, and $RS_2(m,k)$.

5. Examples of User Controls

Figure 11:
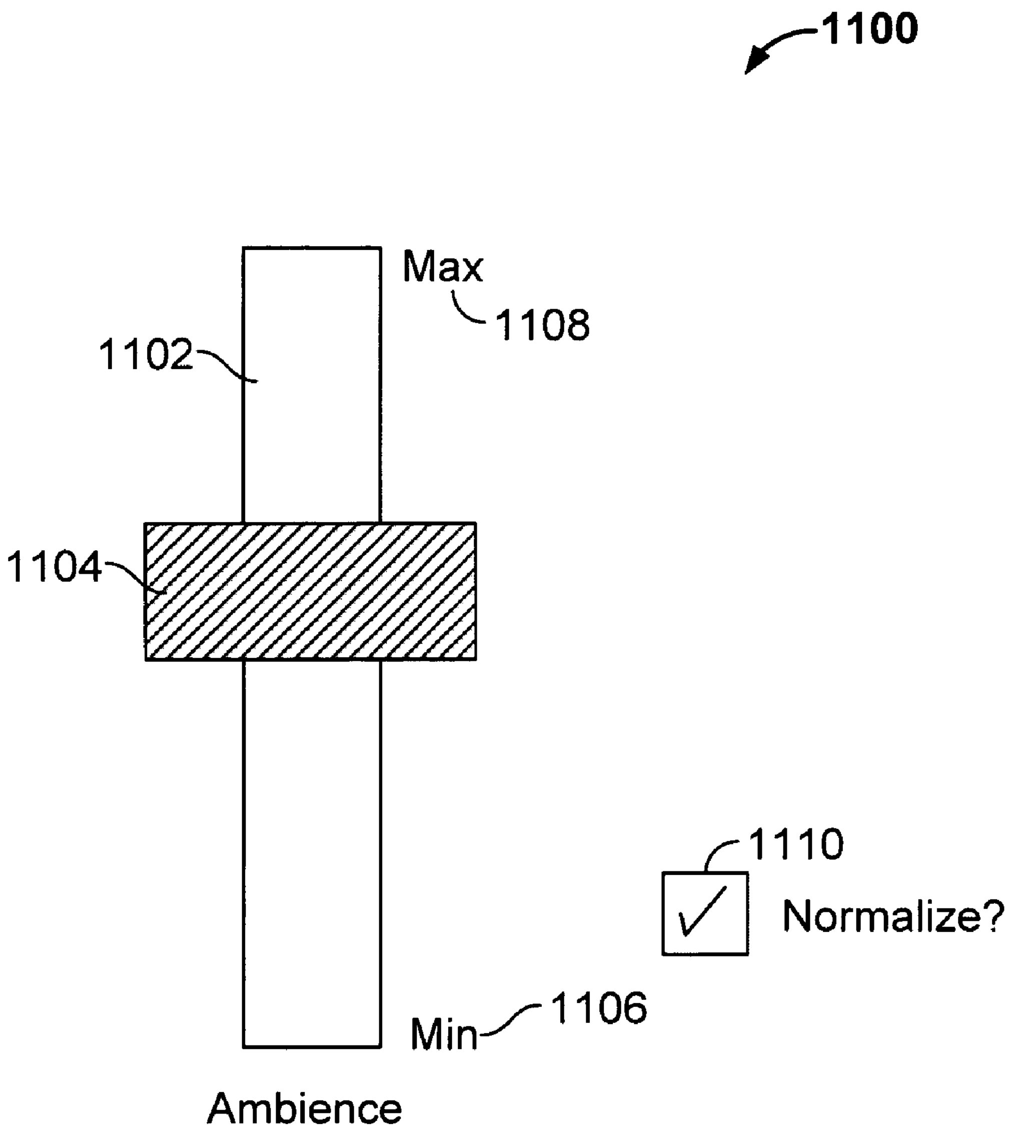
FIG. 11 illustrates a user interface provided in one embodiment to enable a user to indicate a desired level of ambience.

FIG. 11 illustrates a user interface provided in one embodiment to enable a user to indicate a desired level of ambience. The control 1100 comprises a slider 1102 and an ambience level indicator 1104. The slider 1102 has a minimum position 1106 and a maximum position 1108, and the level indicator 1104 may be positioned by a user between the minimum position 1106 and maximum position 1108. In one embodiment, the position of the slider 1104 is mapped to a value for a modification or scaling factor, such as the modification factor $\alpha$ of FIG. 4. In one embodiment, the position of the slider 1104 is mapped to a maximum value for a modification function, such as the maximum value $\mu_{MAX}$ of FIG. 5. In one embodiment, the position of the slider 1104 is mapped to a value for a user-defined gain for controlling the level of ambience-based generated upmix channels, such as the gain $g_{user}$ of FIG. 10A. The control 1100 of FIG. 11 comprises an optional normalized output checkbox control 1110. In one embodiment, if the checkbox 1110 is selected (i.e., the check is displayed, as shown in FIG. 11), the slider 1102 is used to indicate a desired ambience-to-signal output ratio (a "normalized" output ambience level, as described above) to be provided regardless of the ambience-to-signal ratio of the input signal. While FIG. 11 shows a slider, any type of control may be used, including without limitation a knob, dial, or any other control that allows a user to indicate a desired level or value.

Figure 12:
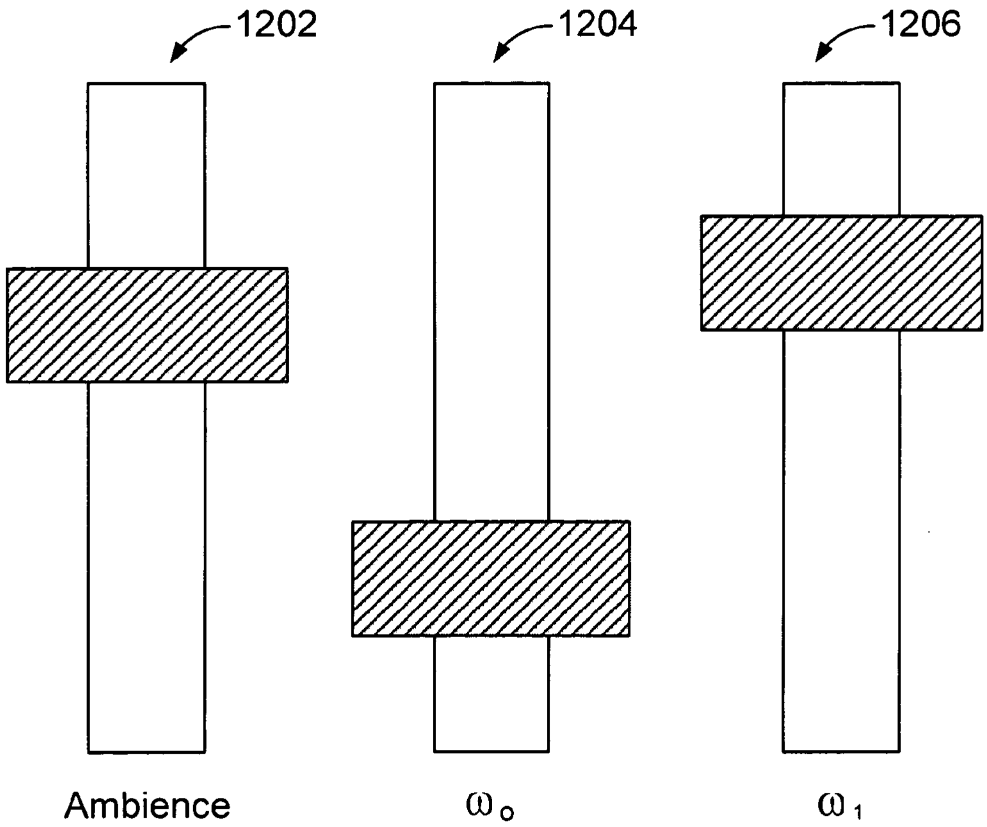
FIG. 12 illustrates a set of controls provided in one embodiment configured to allow a user to define the bandwidth within which ambience information will be used to generate upmix channels.

FIG. 12 illustrates a set of controls provided in one embodiment configured to allow a user to define the bandwidth within which ambience information will be used to generate upmix channels. In one alternative embodiment, the set of controls illustrated in FIG. 12 may be used to define the bandwidth within which ambience components will be modified, as described above in connection with FIGS. 4 and 5. The set of controls comprises an ambience level control 1202 similar to the control 1100 of FIG. 11. In one embodiment, the set of controls may optionally include a normalized output checkbox control (not shown), such as the checkbox control 1110 of FIG. 11. The set of controls further comprises a lower boundary frequency control 1204 and an upper boundary frequency control 1206 configured to allow a user to define the lower and upper boundary frequencies, respectively, within which ambience information will be used to generate upmix channels, such as by indicating the values of the lower boundary frequency $\omega_0$ and the upper boundary frequency $\omega_1$ shown in FIG. 10A as being provided as inputs to the bandpass filter 1008 via line 1010.

Using the techniques described above, and variations and modifications thereof that will be apparent to those of ordinary skill in the art, user-controlled extraction and modification of ambience components may be provided for enhancement and/or upmix of audio signals.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention.

Accordingly, the present embodiments are to be considered as illustrative and not restrictive, and the invention is not to be limited to the details given herein, but may be modified within the scope and equivalents of the appended claims.

What is claimed is:

1. A method for modifying an audio signal comprising a plurality of channel signals, the method comprising:

transforming at least selected ones of the channel signals into a time-frequency domain;

comparing said at least selected ones of the channel signals in the time-frequency domain to identify corresponding portions of said channel signals that are not correlated or are only weakly correlated across channels; and modifying the identified corresponding portions of said channel signals, wherein the step of modifying comprises:

determining for each channel an input ratio in which the numerator comprises a measure of said portions of the channel signal that are uncorrelated or weakly correlated and the denominator comprises a measure of the overall channel signal;

receiving a user input indicating a desired output ratio of uncorrelated or weakly correlated portions to total signal; and applying to said portions of said channel signals that are uncorrelated or weakly correlated a modification factor calculated to modify the channel signals as required to achieve the desired output ratio indicated by the user.

2. The method of claim 1, wherein determining for each channel an input ratio comprises:

extracting the uncorrelated or weakly correlated portions from the overall signal;

determining the energy level of the uncorrelated or weakly correlated portions;

determining the energy level of the overall signal; and dividing the energy level of the uncorrelated or weakly correlated portions by the energy level of the overall signal.

3. The method of claim 2, wherein the modification factor comprises the square root of the result obtained by dividing the user-indicated ratio by the input ratio.

4. A method for providing a generated signal to a playback channel of a multichannel playback system, the method comprising:

receiving an input audio signal comprising a plurality of input channel signals;

transforming at least selected ones of the input channel signals into a time-frequency domain;

comparing said at least selected ones of the input channel signals in the time-frequency domain to identify corresponding portions of said input channel signals that are not correlated or are only weakly correlated;

extracting from each of said input channel signals the identified corresponding portions of said input channel signals that are not correlated or are only weakly correlated;

combining the extracted portions, including:

determining the magnitude of the respective portions of said input channel signals that are not correlated or are only weakly correlated;

taking the absolute difference of the magnitude values; and applying a phase to the result of the absolute difference; and providing to the playback channel a signal comprising at least in part said extracted and combined identified corresponding portions of said input channel signals that are not correlated or are only weakly correlated.

5. The method of claim 4, wherein combining the extracted portions comprises taking the difference between the corresponding extracted portions.

6. The method of claim 4, wherein the playback channel comprises a first playback channel and further comprising providing to at least one additional playback channel a signal comprising at least in part said extracted and combined identified corresponding portions of said input channel signals that are not correlated or are only weakly correlated.

7. The method of claim 6, further comprising decorrelating the signal provided to said first playback channel and the signal provided to said at least one additional playback channel.

8. The method of claim 7, wherein decorrelating the signal provided to said first playback channel and the signal provided to said at least one additional playback channel comprises processing the signal provided to each respective playback channel using an allpass filter configured to apply a phase adjustment that is different than the phase adjustment applied to the respective signals provided to the other playback channel(s).

9. The method of claim 7, wherein decorrelating the signal provided to said first playback channel and the signal provided to said at least one additional playback channel comprises processing the signal provided to each respective playback channel using a delay line configured to apply a delay that is different than the delay applied to the respective signals provided to the other playback channel(s).

10. The method of claim 4, further comprising modifying the extracted and combined portions prior to providing them to the playback channel.

11. The method of claim 10, wherein the modification is determined at least in part by a user input.

12. The method of claim 11, wherein the user input determines at least in part the gain of an amplifier used to process the extracted and combined portions.

13. The method of claim 11, wherein the user input determines at least in part a bandwidth within which the modification is performed.

14. The method of claim 13, wherein the bandwidth is implemented by processing the extracted and combined portions using a bandpass filter and the user input determines at least in part the lower and upper boundary frequencies of the bandpass filter.

15. The method of claim 4, wherein the steps of extracting and combining comprise determining the magnitude of the respective portions of said input channel signals that are not correlated or are only weakly correlated, taking the absolute difference of the magnitude values, and applying the phase of one of the input channels to the result.

16. The method of claim 4, wherein one of the plurality of input channel signals corresponds to the playback channel and wherein the signal provided to the playback channel further comprises the corresponding input channel signal.

* * * * *